United States Patent
Yeung et al.

(10) Patent No.: US 11,942,174 B2
(45) Date of Patent: Mar. 26, 2024

(54) TOPOLOGY-BASED RETIREMENT IN A MEMORY SYSTEM

(71) Applicant: Micron Technology, Inc., Boise, ID (US)

(72) Inventors: Chun S. Yeung, San Jose, CA (US); Deping He, Boise, ID (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/574,024

(22) Filed: Jan. 12, 2022

(65) Prior Publication Data

US 2022/0254434 A1  Aug. 11, 2022

Related U.S. Application Data

(60) Provisional application No. 63/147,679, filed on Feb. 9, 2021.

(51) Int. Cl.
*G11C 29/42* (2006.01)
*G11C 7/04* (2006.01)
(Continued)

(52) U.S. Cl.
CPC .......... *G11C 29/42* (2013.01); *G11C 7/04* (2013.01); *G11C 29/1201* (2013.01);
(Continued)

(58) Field of Classification Search
None
See application file for complete search history.

(56) References Cited

U.S. PATENT DOCUMENTS

| 2011/0066899 A1* | 3/2011 | Kang | G06F 12/0246 711/E12.001 |
| 2014/0068384 A1* | 3/2014 | Kwak | G06F 11/1068 714/773 |

(Continued)

FOREIGN PATENT DOCUMENTS

| CN | 106024061 A | 10/2016 |
| CN | 110543280 A | 12/2019 |

(Continued)

OTHER PUBLICATIONS

Chinese Patent Office, "Office Action," issued in connection with Chinese Patent Application No. 202210106320.X dated Oct. 18, 2023 (22 pages total; 11 pages Original & 11 pages machine translation).

*Primary Examiner* — Guerrier Merant
(74) *Attorney, Agent, or Firm* — Holland & Hart LLP

(57) ABSTRACT

Methods, systems, and devices for topology-based retirement in a memory system are described. In some examples, a memory system or memory device may be configured to evaluate error conditions relative to a physical or electrical organization of a memory array, which may support inferring the presence or absence of defects in one or more structures of a memory device. For example, based on various evaluations of detected errors, a memory system or a memory device may be able to infer a presence of a short-circuit, an open circuit, a dielectric breakdown, or other defects of a memory array that may be related to wear or degradation over time, and retire a portion of a memory array based on such an inference.

23 Claims, 5 Drawing Sheets

(51) Int. Cl.
*G11C 29/12* (2006.01)
*G11C 29/44* (2006.01)

(52) U.S. Cl.
CPC .. *G11C 29/4401* (2013.01); *G11C 2029/1202* (2013.01); *G11C 2029/1204* (2013.01)

(56) References Cited

U.S. PATENT DOCUMENTS

| | | |
|---|---|---|
| 2015/0309872 A1* | 10/2015 | Cai ................... G06F 11/1076 |
| | | 714/764 |
| 2016/0293271 A1 | 10/2016 | Won et al. |
| 2017/0132125 A1* | 5/2017 | Cai ................... G06F 11/1072 |
| 2018/0130544 A1* | 5/2018 | Won ................ G11C 29/50004 |
| 2019/0189239 A1* | 6/2019 | Suzuki .................. G06F 3/0658 |
| 2019/0369685 A1 | 12/2019 | Chang |
| 2020/0278896 A1* | 9/2020 | Kumari ............... G06F 11/1048 |
| 2020/0387314 A1 | 12/2020 | Prosser et al. |
| 2021/0149755 A1 | 5/2021 | Hoei et al. |
| 2022/0254434 A1* | 8/2022 | Yeung .................... G11C 29/88 |

FOREIGN PATENT DOCUMENTS

| | | | |
|---|---|---|---|
| CN | 111538617 A | | 8/2020 |
| KR | 20090066732 A | * | 6/2009 |

* cited by examiner

TOPOLOGY-BASED RETIREMENT IN A MEMORY SYSTEM

CROSS REFERENCE

The present Application for Patent claims priority to U.S. Provisional Patent Application No. 63/147,679 by Yeung et al., entitled "TOPOLOGY-BASED RETIREMENT IN A MEMORY SYSTEM", filed Feb. 9, 2021, which is assigned to the assignee hereof and is expressly incorporated by reference in its entirety herein.

FIELD OF TECHNOLOGY

The following relates generally to one or more systems for memory and more specifically to topology-based retirement in a memory system.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Memory systems may include one or more memory devices that include an array of memory cells and circuitry operable to perform access operations on the memory cells. Various structures of a memory device (e.g., of a memory die) may wear or degrade over time, which may lead to operational failures or otherwise unreliable operation of the memory device. Some memory systems or memory devices may be configured to detect indications of unreliable or failed access operations, and retire portions of a memory array in response to such detections. However, some techniques for detecting unreliable or failed access operations may be overly conservative and lead to excessive retirement of a memory array.

In accordance with examples as disclosed herein, a memory system or memory device may be configured to perform topology-based evaluations for decisions on whether to retire portions of a memory array. For example, a memory system or memory device may be configured to evaluate error conditions relative to a physical or electrical organization of a memory array, which may support inferring the presence or absence of defects (e.g., physical defects, material defects, electrical defects) in one or more structures of a memory device. In some cases, the errors observed in a memory array may be permanent errors that warrant retiring a block or the errors observed in a memory array may be more transient errors that may be resolved. To avoid retiring blocks of memory due to errors that are more transient in nature, techniques may use multiple characterizations of the error to determine whether to retire a block. For example, based on various evaluations of detected errors, a memory system or a memory device may be able to infer a presence of a short-circuit, an open circuit, a dielectric breakdown, or other defects of a memory array that may be related to wear or degradation over time and, in response, may retire a portion of a memory array based on such an inference. Compared to other techniques of array retirement, by implementing one or more aspects of topology-based retirement in accordance with examples as disclosed herein, a memory device may be configured with a larger capacity, a smaller degree of over-provisioning, or a longer life cycle, among other benefits or combinations thereof.

Figure 1:
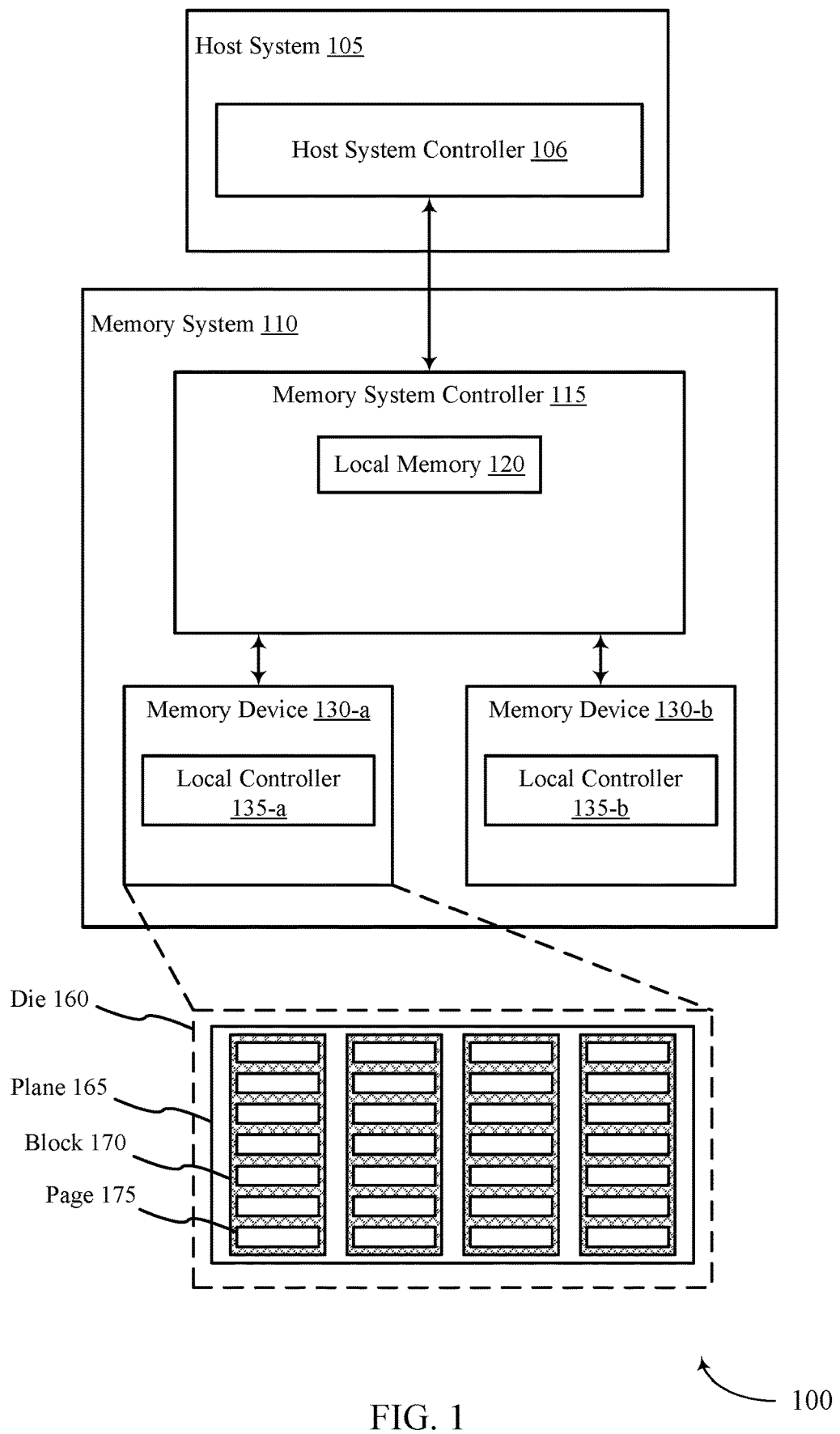
FIG. 1 illustrates an example of a system that supports topology-based retirement in a memory system in accordance with examples as disclosed herein.
Figure 2:
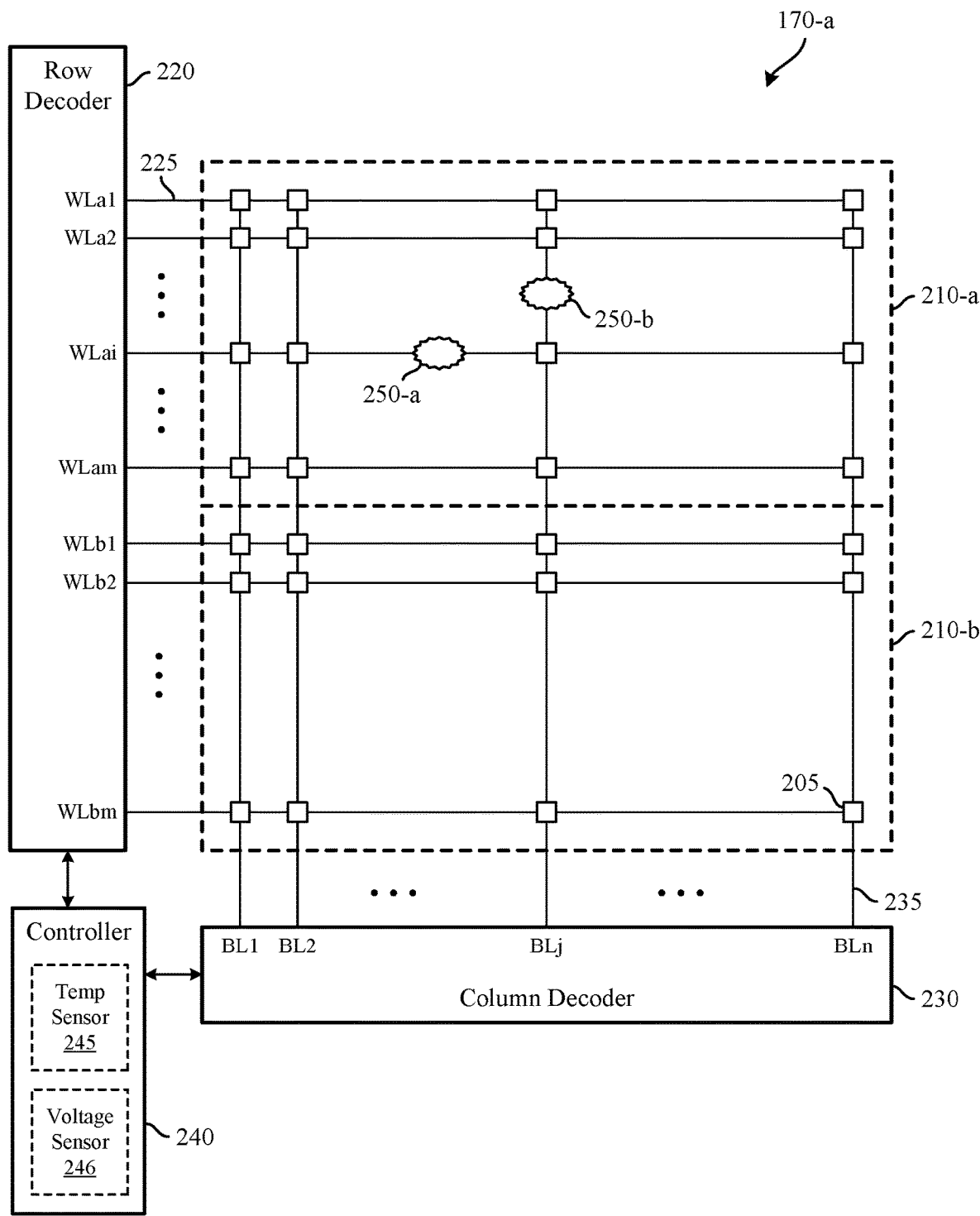
FIG. 2 shows a block diagram of a circuit that supports topology-based retirement in a memory system in accordance with examples as disclosed herein.

Features of the disclosure are initially described in the context of systems, devices, and circuits with reference to FIGS. 1 and 2. Features of the disclosure are described in the context of a flowchart for topology-based retirement with reference to FIG. 3. These and other features of the disclosure are further illustrated by and described with reference to an apparatus diagram and a flowchart that relate to topology-based retirement in a memory system as described with reference to FIGS. 4 and 5.

FIG. 1 illustrates an example of a system 100 that supports topology-based retirement in a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

In some examples, a coupling between the host system 105 and the memory system 110 may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (FeRAM), magneto RAM (MRAM), NOR (e.g., NOR flash) memory, Spin Transfer Torque (STT)-MRAM, conductive bridging random access memory (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include random access memory (RAM) memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line, which may alternatively be referred to as a bit line.

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., logical block address) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases (e.g., to improve reliability, to improve data retention), a memory system controller 115 or a local controller 135 may perform one or more refresh operations, which may include erasing and re-programming memory cells of a die 160 to re-establish a physical state (e.g., stored charge, polarization state, resistance state) or logical state stored in the memory cells. In some examples, refresh operations may be performed at a block level (e.g., a physical block level), where such refresh operations may include erasing and re-programming one or more blocks 170. Refresh operations may be controlled or managed by a host system 105 (e.g., a host system controller 106), a memory system 110 (e.g., a memory system controller 115, a local controller 135), or various combinations thereof, which may include refresh configuration, refresh initiation, refresh interruption, and refresh progress management. In various examples of host-initiated refresh operations, a memory system 110 may be configured to perform refresh operations requested by a host system 105 regardless of whether the memory system 110 has identified that a block 170 meets a criteria for refresh operations, or may be configured to perform refresh operations requested by a host system 105 on blocks 170 that the memory system 110 has identified as meeting a criteria for refresh operations. Additionally or alternatively, a memory system 110 may initiate refresh operations that may be transparent to the host system 105.

The system 100 may include any quantity of non-transitory computer readable media that support topology-based retirement in a memory system. For example, the host system 105, the memory system controller 115, or a memory device 130 may include or otherwise may access one or more non-transitory computer readable media storing instructions (e.g., firmware) for performing the functions ascribed herein to a host system 105, a memory system controller 115, or a memory device 130 (e.g., a local controller 135). For example, such instructions, if executed by a host system 105 (e.g., by a host system controller 106), by a memory system controller 115, or by a memory device 130 (e.g., by a local controller 135), may cause the host system 105, the memory system controller 115, or the memory device 130 to perform one or more associated functions as described herein.

In some examples, structures of a memory device 130 (e.g., of a die 160) may wear or degrade over time, which may lead to operational failures or otherwise unreliable operation of the memory device 130. Some applications may not be configured to tolerate a loss or reduction of storage capacity in a memory device 130, so a memory system 110 or a memory device 130 may be configured to detect indications of unreliable or failed access operations, and retire portions of a memory array in response to such indications. For example, a memory device 130 may be over-provisioned with spare blocks 170 (e.g., a pool of replacement blocks 170) that provide storage beyond a stated or rated capacity of the memory device 130, but that may not be used until they are made active or valid. As valid blocks 170 (e.g., originally-provisioned blocks 170) wear or degrade, they may be retired by taking them out of service and replacing them with spare blocks 170 (e.g., removing a retired block 170 from a physical address space available for access operations, adding a spare block 170 to a physical address space available for access operations).

In some examples, a block retirement may include indicating that a retired block 170 is not available for access (e.g., not available for writing information, marking physical addresses associated with the retired block 170 as invalid) and indicating that a spare block 170 is available for access. In some examples, a block retirement may include removing an indication that a retired block 170 is available for access, and adding an indication that a spare block 170 is available for access. In some cases, a retirement may include or be accompanied by a transfer of information from a retired block 170 into another block 170 (e.g., an already-valid or already-available block 170, a newly-valid or newly-available block 170, such as a spare block 170 associated with an over-provisioning), which may include a remapping of logical addresses to new physical addresses of the other block 170. In some examples, a retirement may include a partial or restricted access of a block 170, such as configuring a retired block 170 for operation in a read-only mode (e.g., to support aspects of information retrieval from a retired block 170).

According to some techniques, retirement of a block 170 may be initiated in response to an error detection when accessing memory cells of the block 170. For example, a block 170 may be retired in response to an erase failure of the block 170 (e.g., the block 170 returning an erase status fail, such as the block 170 failing an erase operation) or a program failure of the block 170 (e.g., one or more pages 175 of the block 170 returning a program status fail, such as pages 175 failing a write operation). Additionally or alternatively, a block 170 may be retired in response to a read scan failure, such as an uncorrectable error (e.g., an uncorrectable error correction code (UECC) error, an uncorrectable read error) of the block 170 (e.g., during a garbage collection operation). However, some techniques for detecting unreliable or failed access operations (e.g., failed read operations) may be overly conservative, such as being overly sensitive to transient error conditions, which may lead to excessive retirement, accelerated depletion of spare blocks 170, or reduced life cycle of a memory device 130, among other drawbacks or combinations thereof.

In accordance with examples as disclosed herein, a memory system 110 or a memory device 130 may be configured to perform topology-based evaluations for retirement of portions of a memory array. For example, a memory system 110 (e.g., a memory system controller 115) or a memory device 130 (e.g., a local controller 135) may be configured to evaluate error conditions relative to a physical or electrical organization of a die 160, or a memory array thereof, which may support inferring a presence or absence of defects (e.g., physical defects, material defects, electrical defects) in one or more structures of a memory device 130. For example, based on various evaluations of detected errors, a memory system 110 or a memory device 130 may be able to detect or infer a presence of a short-circuit defect, an open circuit defect, a dielectric breakdown or other leakage defect, or other defects of a memory array that may be related to wear or degradation over time and, in response, may retire a portion of a memory array based on such a detection or inference. In some examples, such techniques may support distinguishing between intrinsic and extrinsic errors or failures, which may inhibit, lessen, or otherwise mitigate retirement techniques that may be overly sensitive to transient phenomena such as elevated temperatures, voltage irregularities, radiation, or other transients. Compared to other techniques of array retirement that do not consider a physical or electrical organization of a die 160, or techniques that do not otherwise distinguish between intrinsic and extrinsic failures, implementing one or more aspects of topology-based retirement in accordance with examples as disclosed herein may support a memory device 130 being configured with a larger capacity, a smaller degree of over-provisioning, or a longer life cycle, among other beneficial configurations or combinations thereof.

FIG. 2 shows a block diagram of a circuit 200 that supports topology-based retirement in a memory system in accordance with examples as disclosed herein. The circuit 200 may be included in a memory system 110, and may include one or more components of a memory device 130. For example, the circuit 200 illustrates an example of a block 170-*a* including an array of memory cells 205. Each of the memory cells 205 may be located at or otherwise accessible according to an intersection of a word line 225 (e.g., a WL) and a bit line 235 (e.g., a BL), which may each be referred to as access lines of the block 170-*a*. Memory cells 205 along a word line 225 may be an example of a page 175. The word lines 225 and bit lines 235 may be coupled with a row decoder 220 and a column decoder 230, respectively, for controlling various biasing or activation of the respective access lines. In some examples, the row decoder 220 and the column decoder 230 may be components of a local controller 135, which may support access operations such as writing logic states to memory cells 205 or sensing logic states stored in memory cells 205, among other operations and signaling thereof. The row decoder 220 and the column decoder 230 may be coupled with a controller 240 that is configured to perform various techniques for topology-based retirement as disclosed herein. In various examples, the controller 240 may be included in a memory system controller 115, included in a local controller 135, or distributed between a memory system controller 115 and a local controller 135, among other configurations.

The memory cells 205 may be physically or electrically arranged according to subblocks 210 (e.g., a first subblock 210-*a* and a second subblock 210-*b*). In some examples, each of the subblocks 210 may include or refer to a subset of the word lines 225 of a block 170 (e.g., subblock 210-*a* including or associated with word lines WLa1 through WLam, subblock 210-*b* including or associated with word lines WLb1 through WLbm). Although the block 170-*a* is illustrated as including two subblocks 210, a block 170 in accordance with the described techniques may include any quantity of subblocks 210 (e.g., two, three, four, five, six, seven, eight, etc.). Additionally or alternatively, although the subblocks 210 are illustrated as each including a respective subset of the word lines 225 of the block 170-*a* and all of the bit lines 235 of the block 170-*a*, in some examples, subblocks 210 may each include a respective subset of the bit lines 235 of a block 170 (e.g., in combination with including some or all of the word lines 225 of the block 170).

In some examples, one or more structures of the circuit 200 (e.g., structures of a die 160) may wear or degrade over time, which may lead to one or more physical defects. For example, circuit 200 illustrates an example of a defect 250-*a*, which may be associated with at least a word line WLai, and a defect 250-*b*, which may be associated with at least a bit line BLj. The defects 250 may refer to various degradation or failure of one or more physical elements of the circuit 200. For example, a defect 250 may refer to a short circuit defect or other dielectric breakdown (e.g., a leakage path), such as a short circuit between an access line and a chassis or ground structure of a die 160, a short circuit between an access line and a voltage source (e.g., a positive voltage source, a negative voltage source), a short circuit between a first access line and a second access line (e.g., between a first word line 225 and a second word line 225, between a first bit line 235 and a second bit line 235, between a word line 225 and a bit line 235), or between other structures of the circuit 200. In some examples, a defect 250 may refer to an open circuit defect or other reduction or suppression of conductivity, such as a break in conductivity or a break or other cross-sectional reduction in a conductive path of an access line. The examples of defects 250-*a* and 250-*b* are for illustrative purposes, and a circuit may develop any quantity of one or more defects 250 in various locations of a circuit of a memory device 130, and a defect 150 may affect any quantity of one or more access lines.

In some examples, a defect 250 may cause errors when accessing memory cells 205 of the block 170-*a*, which may include uncorrectable errors (e.g., when a quantity of errors exceeds an error correction capability of a memory system 110 or a memory device 130 that includes the circuit 200, when an error is not due to a temporary condition). For example, if the defect 250-*a* is an open circuit defect, the defect 250-*a* may cause errors when accessing memory cells 205 along the word line WLai that are downstream of the defect 250-*a* (e.g., downstream relative to the row decoder, farther from the row decoder 220 than the defect 250-*a*) due to signals not being conveyed through the defect 250-*a*). Likewise, if the defect 250-*b* is an open circuit defect, the defect 250-*b* may cause errors when accessing memory cells 205 along the bit line BLj that are downstream of the defect 250-*b* (e.g., downstream relative to the column decoder 230, farther from the column decoder 230 than the defect 250-*b*) due to signals not being conveyed through the defect 250-*b*). In examples where a defect 250 is a short circuit, dielectric breakdown, or leakage defect associated with an access line, such a defect 250 may cause errors when accessing both memory cells 205 that are downstream of the defect 250 and memory cells 205 that are upstream of the defect 250 (e.g., to voltage instability or charge leakage that generally affects signaling of the access line).

In some examples, a topology of the block 170-*a* may be leveraged for evaluating error conditions of the block 170-*a*. For example, the subblock 210-*a* exhibiting a higher occurrence of errors (e.g., read errors, uncorrectable errors) than the subblock 210-*b* may be indicative of a defect 250-*b* (e.g., an open circuit defect), because such a defect 250-*b* may inhibit or otherwise disrupt signaling between the column decoder 230 (e.g., and the controller 240, and sensing circuitry coupled with the column decoder and configured to detect logic states stored by memory cells 205) and memory cells 205 that are downstream of the defect 250-*b*, and may not affect accessing the memory cells 205 of the subblock 210-*b*. In some examples, the subblock 210-*a* exhibiting a higher occurrence of errors than the subblock 210-*b*, or the word line WLai exhibiting a higher occurrence of errors than other (e.g., neighboring, adjacent) word lines 225, may be indicative of a defect 250-*a* (e.g., an open circuit defect or a closed circuit defect), because such a defect 250-*a* may induce failures or errors along the word line WLai (e.g., downstream of the defect 250-*a*, upstream of the defect 250-*a*), which may not affect accessing the memory cells 205 of the subblock 210-*b* or other word lines 225. In some examples, topological comparisons of errors such as these may be additionally or alternatively performed between or among bit lines 235, or groups of bit lines 235 (e.g., subblocks 210 each including respective sets of bit lines 235) for various evaluations to detect or infer a presence of one or more defects 250.

Thus, in accordance with these and other examples, a comparison of quantities of errors between or among subblocks 210, between or among word lines 225, or between or among bit lines 235, or other topological comparisons or combinations thereof, may be leveraged to evaluate or infer the presence of defects 250. For example, a signature of a defect 250 may be identified or inferred based on which subblocks 210, which word lines 225, or which bit lines 235 demonstrate access errors (e.g., subblocks 210 or word lines 225 that are physically or electrically located relatively farther from a column decoder 230, bit lines 235 that are located relatively farther from a row decoder 220, or subblocks 210, word lines 225, or bit lines 235 having significantly higher occurrence of errors than their neighbors), or identified or inferred based on how many errors occur (e.g., how many bits are flipped, how many codewords within a word line 225 have errors), or identified or inferred based on a combination of these and other characteristics. Such topological comparisons (e.g., comparisons that consider relative physical or electrical groupings or positioning of detected errors) may improve retirement evaluations by improving insight into the cause of access errors or failures. For example, according to these and other techniques in accordance with examples as disclosed herein, such comparisons may support distinguishing between extrinsic failures (e.g., local physical issues, such as defects 250, that may be persistent) and intrinsic failures (e.g., transient effects that may not be persistent, stochastic errors that may not have an association with a particular physical or electrical location in an array), which may avoid unnecessarily retiring blocks 170 that are affected by transient issues but may be otherwise normally operable (e.g., upon the passing or clearing of transient conditions).

In some examples, retirement evaluations may be conditional or otherwise modified based on an evaluation or detection of operating conditions, such as observations of temperature, voltage, or other conditions that may affect operation of a memory system 110 or memory device 130. For example, elevated operating temperatures may be associated with increased occurrence of access errors (e.g., appearing as a relatively substantial, localized failure), but occurrence of such access errors may decrease as operating temperature falls. Thus, retirement of a block 170 based on error detections while at an elevated operating temperature may be overly conservative, because the block 170 may perform normally or otherwise acceptably at lower temperatures. Accordingly, some examples of topology-based retirement evaluations may include evaluations of conditions that may be transient, such as retiring a block 170 based on error evaluations if a temperature (e.g., as measured or detected by a temperature sensor 245) is found to be within a nominal or otherwise configured range, or if a voltage (e.g., as measured or detected by a voltage sensor 246) is found to be within a nominal or otherwise configured range, among other evaluations that consider whether operating conditions of a memory system 110 or a memory device 130 are in a normal range or are subject to transient effects that may have induced observed errors.

In an example of a topology-based evaluation for retirement of a block 170, if an error (e.g., an uncorrectable error, a UECC error) occurs during a read operation of the block 170, a controller may initiate a retirement evaluation that includes a refresh of the block 170 or other read scan of the block 170. During the refresh or read scan, a controller (e.g., firmware) may keep track of error counts (e.g., UECC count) per word line 225 and per subblock 210, which may include error counts from some or all upper pages of the block 170. After completion of at least part of the refresh or other read scan, a determination to retire the block 170 may be based on various error criteria and operating condition criteria. For example, the block 170 may be retired if a quantity of errors for some quantity of word lines 225 (e.g., one word line, two word lines) is greater than or equal to four errors, or some other threshold (e.g., a variable that may be configured during a device qualification), while other word lines 225 have zero errors. Additionally or alternatively, the block 170 may be retired if a quantity of errors for a subblock 210 is greater than a threshold (e.g., a configured parameter, or a variable that is configured during a device qualification, or a combination thereof), while other subblocks 210 have zero errors. In some examples, either or both of such retirement determinations may be conditional based on operating temperature, such as retirement being conditional on a difference between write temperature and read temperature being less than a temperature threshold. In some examples, if a read temperature is not outside a nominal or configured range (e.g., within a range defined by a configured lower temperature and a configured upper temperature), the block 170 may be retired, and if a read temperature is outside the nominal or configured range, the block 170 may not be retired (e.g., due to an elevated probability that observed errors are related to a transient effect). In some examples, such a retirement determination may also be conditional on the availability of spare blocks 170 (e.g., of an overprovisioning, of a pool of spare blocks 170).

Figure 3:
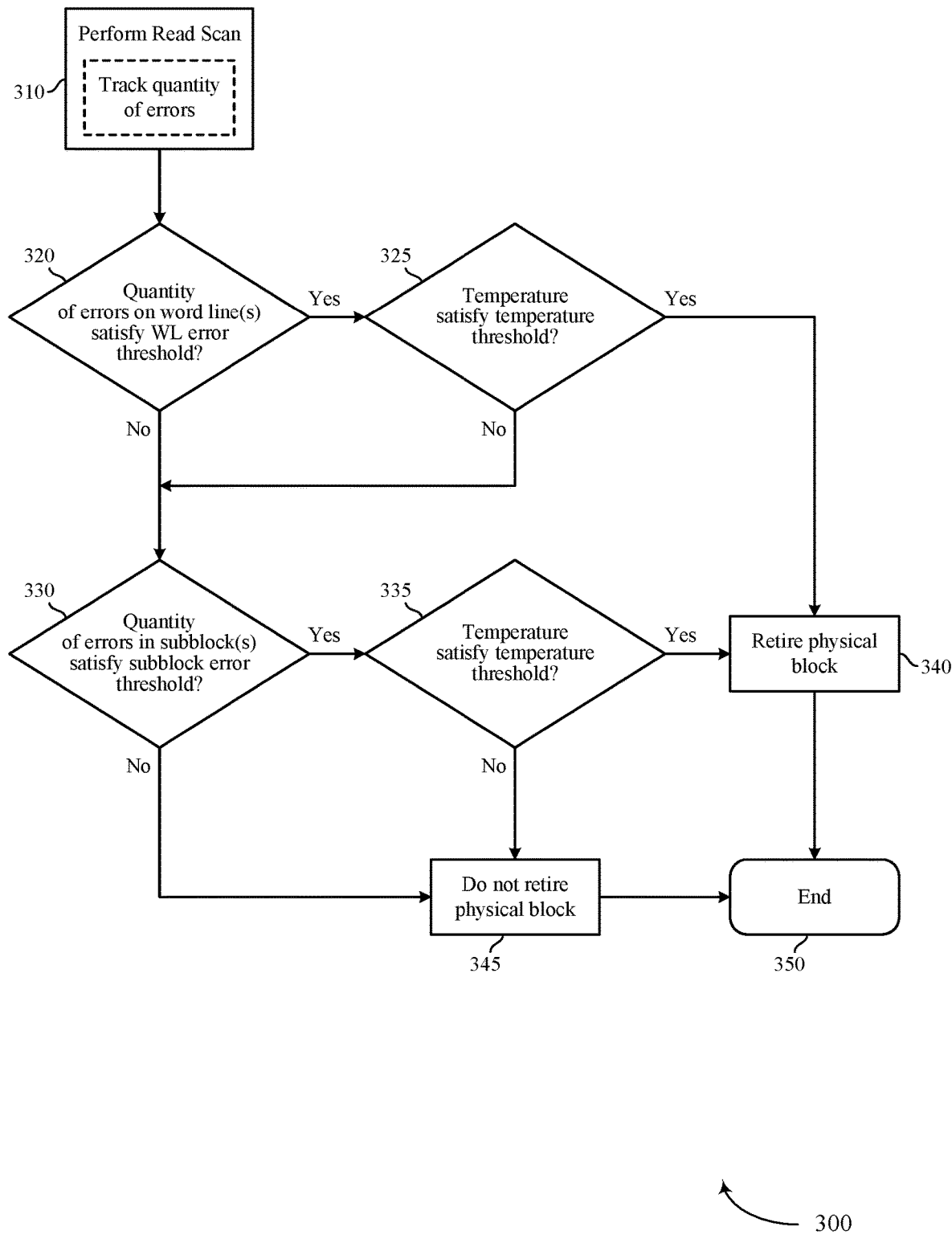
FIG. 3 shows a process flow illustrating a method that supports topology-based retirement in a memory system in accordance with examples as disclosed herein.

FIG. 3 shows a process flow illustrating a method 300 that supports topology-based retirement in a memory system in accordance with examples as disclosed herein. Aspects of the method 300 may be implemented by a controller (e.g., a memory system controller 115, a local controller 135, a controller 240), among other components. Additionally or alternatively, aspects of the method 300 may be implemented as instructions stored in memory (e.g., firmware stored in a memory coupled with a memory system 110 or a memory device 130). For example, the instructions, if executed by a controller, may cause the controller to perform the operations of the method 300.

In some examples, the method 300 may begin (e.g., be initiated) according to a condition or criteria being satisfied. For example, the method 300 may begin upon a determination of an error condition, such as an uncorrectable read error (e.g., of a block 170), which may be determined during the course of normal operations (e.g., during a read operation performed in response to a read command from a host system 105), media management operations (e.g., a garbage collection operation, a wear leveling operation), or other operations. In some examples, the method 300 may begin according to an initiation interval, such as satisfying a threshold duration (e.g., a data retention duration) or a threshold quantity of access operations (e.g., read operations, since a power cycle, since an installation in a user product, since a prior retirement evaluation such as method 300), among other intervals. In some examples, the method 300 may begin if an operating temperature satisfies a threshold, which may or may not be combined with other initiation criteria (e.g., a determination of an error condition while operating in a configured temperature range, upon satisfying an initiation interval while operating in a configured temperature range).

At 310, the method 300 may include performing a read scan of the memory array, such as a refresh operation, a media scan, a media management operation, or some other scanning operation of a block 170 that was identified as having an uncorrectable error (e.g., a UECC error) or a block that was otherwise identified for a retirement evaluation. In some examples, a refresh of the block 170 at 310 may include moving the information stored in the block 170 to another block 170, which accordingly may include reading the whole block 170 (e.g., pages 175 of the block). Other examples of a read scan at 310 may or may not include a refresh operation. For example, the method 300 may additionally or alternatively include other types of read scans that include reading a block 170 (e.g., each page 175 of a block 170) for a topology-based retirement evaluation, which may or may not include moving information or otherwise performing write operations associated with data stored in the block 170.

As part of or in parallel with the read scan of the block 170 (e.g., while reading the block 170 associated with the uncorrectable error), the method 300 may include tracking a quantity of errors (e.g., errors identified while performing the read scan of 310, read errors, uncorrectable errors, UECC errors) in accordance with a topology of the block 170. For example, the method 300 may include tracking a quantity of errors per word line 225 and a quantity of errors per subblock 210. Although the method 300 is described in the context of errors per subblock 210, in some examples, the method 300 may be modified by additionally or alternatively tracking a quantity of errors per bit line 235 or groups of bit lines 235, which may support finer granularity for retirement evaluations. In various examples, the method 300 may proceed to 320 after the read scan operations of 310 are partially or fully complete.

At 320, the method 300 may include determining whether a quantity of errors on one or more WLs satisfies (e.g., is greater than, is greater than or equal to) a WL error threshold. In some examples, an evaluation of 320 may include a stepwise or otherwise individual comparison of respective errors for one or more of the WLs of the block 170 (e.g., whether a quantity or errors on a first WL 225 is greater than a threshold, whether a quantity of errors on a second WL 225 is greater than a threshold, and so on). In some examples, an evaluation of 320 may include a determination of whether some WLs 225 (e.g., WLs that are relatively closer to a column decoder 230) are associated with a quantity of errors that is less than or otherwise satisfies a first threshold and other WLs 225 (e.g., WLs that are relatively farther from a column decoder 230) are associated with a quantity of errors that is greater than or otherwise satisfies a second threshold. WL error thresholds may be a fixed or otherwise configured value (e.g., one error, four errors, or any other quantity of errors), which may be programmed as part of a manufacturing operation. In some examples, the WL error threshold may be a relative value, such as an average quantity of errors per WL 225 (e.g., for WLs other than a WL being evaluated, for all WLs of the block), or a quantity of errors for one or more neighboring WLs 225 (e.g., one or more WLs directly adjacent to a WL being evaluated, one or more sets of WLs directly adjacent to a WL being evaluated), among other examples of comparisons between quantities of errors associated with different WLs 225. In some examples, an evaluation at 320 may include a determination of whether a quantity of UECC errors (e.g., on a defined page type) on some quantity of one or more WLs 225 is greater than a WL UECC threshold. If, at 320, a quantity of errors on one or more WLs 225 satisfies the WL error threshold (e.g., indicating error conditions that may be indicative of a defect 250), the method 300 may proceed to 325. If, at 320, a quantity of errors on one or more WLs 225 does not satisfy the WL error threshold (e.g., indicating error conditions that may not be indicative of a defect 250), the method 300 may proceed to 330.

At 325, the method 300 may include determining whether a temperature of the memory system 110 (e.g., of the memory device 130, of the die 160) satisfies (e.g., is less than, is less than or equal to) a threshold. In some examples, an evaluation at 325 may include a determination of whether a current temperature satisfies a threshold, or whether a temperature during the read scan operation of 310 satisfies a threshold. In some examples, an evaluation at 325 may include a determination of whether an absolute difference between a read temperature (e.g., a temperature associated with reading the memory block 170, a temperature associated with the read scan operations of 310) and a write temperature (e.g., a temperature associated with the writing of data to the memory block 170) is less than a threshold temperature difference.

If, at 325, the temperature of the memory system 110 satisfies the threshold (e.g., indicating a relatively higher likelihood of tracked WL errors being associated with a defect 250, indicating a relatively lower likelihood of tracked WL errors being associated with transients), the method 300 may proceed to 340. If, at 325, the temperature of the memory system 110 does not satisfy the threshold (e.g., indicating a relatively lower likelihood of tracked WL errors being associated with a defect, indicating a relatively higher likelihood of tracked WL errors being associated with transients), the method 300 may proceed to 330.

At 330, the method 300 may include determining whether a quantity of errors on one or more subblocks 210 satisfies (e.g., is greater than, is greater than or equal to) a subblock error threshold. In some examples, an evaluation of 330 may include a stepwise or otherwise individual comparison of respective errors for one or more of the subblocks 210 of the block 170 (e.g., whether a quantity or errors on a first subblock is greater than a threshold, whether a quantity of errors on a second subblock is greater than a threshold, and so on). In some examples, an evaluation of 330 may include a determination of whether some subblocks 210 (e.g., subblocks that are relatively closer to a row decoder 220) are associated with a quantity of errors that is less than or otherwise satisfies a first threshold and other subblocks 210 (e.g., subblocks that are relatively farther from a row decoder 220) are associated with a quantity of errors that is greater than or otherwise satisfies a second threshold. Subblock error thresholds may be a fixed or otherwise configured value, which may be programmed as part of a manufacturing operation. In some examples, the subblock error threshold may be a relative value, such as an average quantity of errors per subblock 210 (e.g., for subblocks other than a subblock being evaluated, for some or all subblocks of the block), or a quantity of errors for one or more neighboring subblocks 210 (e.g., one or more subblocks directly adjacent to a subblock being evaluated, one or more sets of subblocks directly adjacent to a subblock being evaluated), among other examples of comparisons between quantities of errors associated with different subblocks 210. In some examples, an evaluation at 330 may include a determination of whether a quantity of UECC errors (e.g., on a defined page type) on any one or more subblocks 210 is greater than a subblock threshold. If, at 330, a quantity of errors on one or more subblocks 210 satisfies the subblock error threshold (e.g., indicating error conditions that may be indicative of a defect 250), the method 300 may proceed to 335. If, at 330, a quantity of errors on one or more subblocks 210 (e.g., some or all subblocks) does not satisfy the subblock error threshold (e.g., indicating error conditions that may not be indicative of a defect 250), the method 300 may proceed to 345. Although the operations of 330 are shown as being after the operations of 320, in some examples, the relative position may be reversed.

At 335, the method 300 may include determining whether a temperature of the memory system 110 (e.g., of the memory device 130, of the die 160) satisfies (e.g., is less than, is less than or equal to) a threshold, which may or may not be a same evaluation or a similar evaluation as 325 (e.g., using a same or different temperature threshold, using a same or different reference temperature). If, at 335, the temperature of the memory system 110 satisfies the threshold (e.g., indicating a relatively higher likelihood of tracked subblock errors being associated with a defect 250, indicating a relatively lower likelihood of tracked subblock errors being associated with transients), the method 300 may proceed to 340. If, at 335, the temperature of the memory system 110 does not satisfy the threshold (e.g., indicating a relatively lower likelihood of tracked subblock errors being associated with a defect, indicating a relatively higher likelihood of tracked subblock errors being associated with transients), the method 300 may proceed to 345.

At 340, the method 300 may include retiring the block 170. In various examples, retiring the block 170 may include setting an indication that the block 170 is generally unavailable for access operations or unavailable for write operations. In some examples, the block 170 may still be operable in a read-only configuration. The physical addresses of the block 170 may be replaced by physical addresses of a new block 170 (e.g., from a replacement pool), which may be remapped to logical addresses in an L2P table. At 345, the method 300 may include not retiring the subblock, and the method may proceed to 350.

At 350, the method 300 may end. In various examples, the ending of the method 300 may or may not include an indication that the method 300 has ended. In some examples, the ending of the method 300 may include an indication that the read scan of 310 has ended. In some examples, the ending of the method 300 may include a reallocation or idling of resources (e.g., processing resources, cache resources) that were used during the method 300.

By applying these and other techniques for topology-based retirement in accordance with examples as disclosed herein, a memory system 110 may be provided with improved performance compared to other techniques that do not include topology-based evaluations for retirement. For example, the described techniques may reduce a probability of retiring blocks 170 with errors that were related to transients, but are otherwise still operable (e.g., allowing transient failures and intrinsic issues to be ignored). In some examples, implementing such techniques may reduce a quantity of spare blocks 170 (e.g., of a replacement pool) or otherwise reduce a degree of overprovisioning in a memory system 110 for a given life cycle. Moreover, in some examples, a transition to a read-only mode may be delayed, or a life cycle of a memory system 110 may otherwise be lengthened due to more efficient block usage (e.g., more efficient use of over-provisioning) for a given quantity of spare blocks 170.

Figure 4:
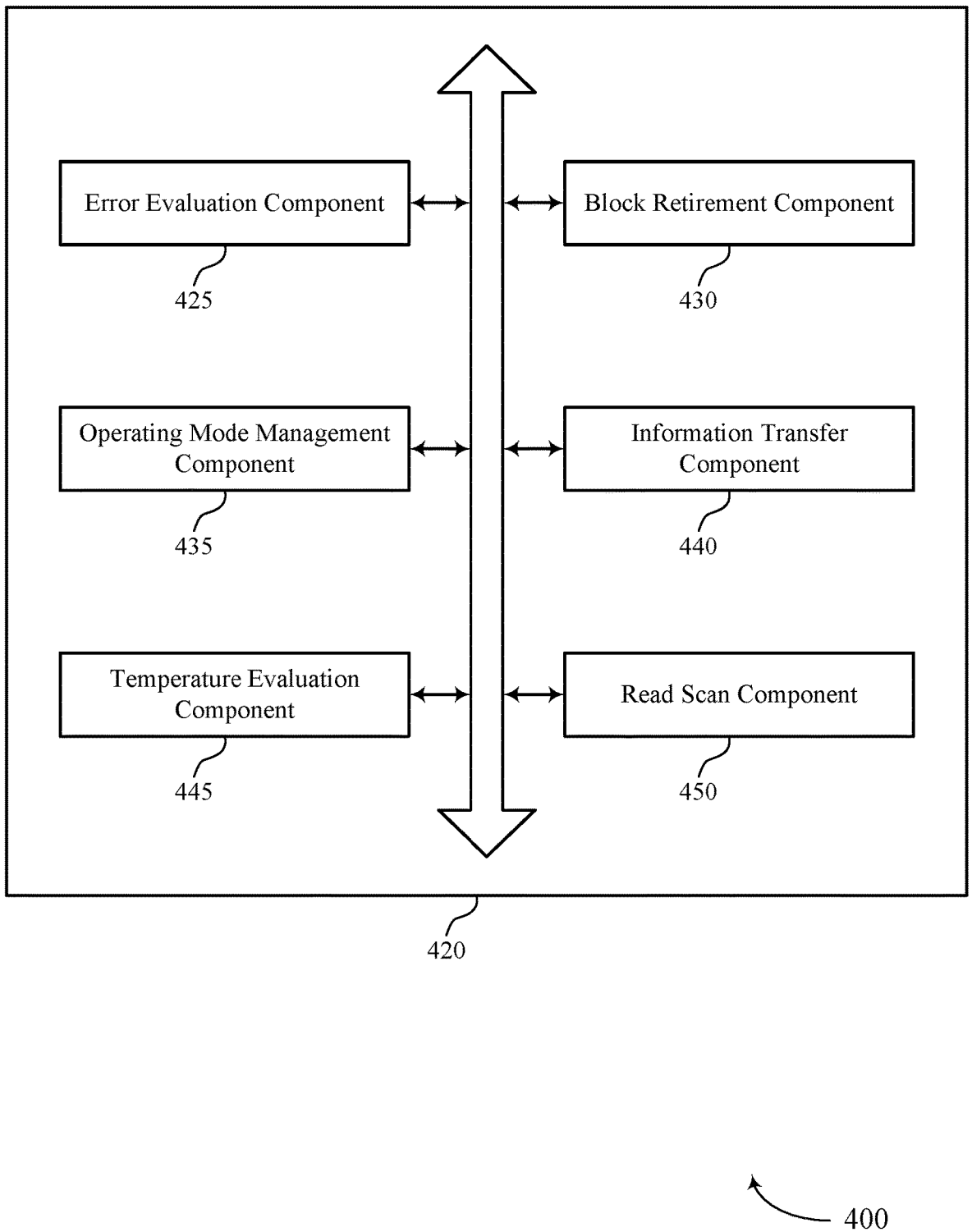
FIG. 4 shows a block diagram of a memory system that supports topology-based retirement in a memory system in accordance with examples as disclosed herein.

FIG. 4 shows a block diagram 400 of a memory system 420 that supports topology-based retirement in a memory system in accordance with examples as disclosed herein. The memory system 420 may be an example of aspects of a memory system as described with reference to FIGS. 1 through 3 (e.g., a memory system 110). The memory system 420, or various components thereof (e.g., a memory system controller 115, a local controller 135), may be an example of means for performing various aspects of topology-based retirement in a memory system as described herein. For example, the memory system 420 may include an error evaluation component 425, a block retirement component 430, an operating mode management component 435, an information transfer component 440, a temperature evaluation component 445, a read scan component 450, or any combination thereof. Each of these components may communicate, directly or indirectly, with one another (e.g., via one or more buses).

The error evaluation component 425 may be configured as or otherwise support a means for determining a first quantity of access errors for a first subblock of a block of memory cells of the memory system 420. In some examples, the error evaluation component 425 may be configured as or otherwise support a means for determining a second quantity of access errors for a second subblock of the block of memory cells. In some examples, the block retirement component 430 may be configured as or otherwise support a means for retiring the block of memory cells based at least in part on (e.g., in response to, as initiated by, after meeting a condition of) a comparison between the first quantity of access errors and the second quantity of access errors.

In some examples, to support retiring the block of memory cells, the block retirement component 430 may be configured as or otherwise support a means for retiring the block of memory cells based at least in part on (e.g., in response to, as initiated by, after meeting a condition of) a difference between the second quantity of access errors and the first quantity of access errors satisfying a threshold (e.g., meeting or exceeding the threshold).

In some examples, to support retiring the block of memory cells, the block retirement component 430 may be configured as or otherwise support a means for retiring the block of memory cells based at least in part on (e.g., in response to, as initiated by, after meeting a condition of) the first quantity of access errors satisfying a first threshold (e.g., meeting or being below the first threshold) and the second quantity of access errors satisfying a second threshold (e.g., meeting or exceeding the second threshold).

In some examples, the operating mode management component 435 may be configured as or otherwise support a means for operating the block of memory cells in a read-only mode based at least in part on (e.g., in response to, as initiated by, after meeting a condition of) the retiring.

In some examples, to support retiring the block of memory cells, the block retirement component 430 may be configured as or otherwise support a means for indicating that the block of memory cells is unavailable for writing information, or a means for removing an indication that the block of memory cells is available for writing, or a combination thereof.

In some examples, to support retiring the block of memory cells, the information transfer component 440 may be configured as or otherwise support a means for transferring information stored in the block of memory cells to a second block of memory cells of the memory system 420.

In some examples, the temperature evaluation component 445 may be configured as or otherwise support a means for determining an operating temperature of the memory system 420 associated with the first quantity of access errors and the second quantity of access errors. In some examples, to support retiring the block of memory cells, the block retirement component 430 may be configured as or otherwise support a means for retiring the block of memory cells based at least in part on (e.g., in response to, as initiated by, after meeting a condition of) the comparison between the first quantity of access errors and the second quantity of access errors and the operating temperature satisfying a temperature threshold (e.g., meeting or being below a temperature threshold).

In some examples, the error evaluation component 425 may be configured as or otherwise support a means for identifying an uncorrectable error based at least in part on (e.g., during, as part of, in response to) accessing the block of memory cells. In some examples, the read scan component 450 may be configured as or otherwise support a means for initiating a read scan operation (e.g., a refresh operation or portion thereof, a media management operation that includes a read scan) on the block of memory cells based at least in part on (e.g., in response to, as initiated by, after meeting a condition of) the error evaluation component 425 identifying the uncorrectable error. In some examples, the error evaluation component 425 may be configured as or otherwise support a means for determining the first quantity of access errors and the second quantity of access errors based at least in part on the read scan component 450 initiating the read scan operation (e.g., during the read scan operation, as part of the read scan operation, in response to the read scan operation).

In some examples, to support determining the first quantity of access errors, the error evaluation component 425 may be configured as or otherwise support a means for determining a first quantity of errors associated with a word line of the first subblock. In some examples, to support determining the second quantity of access errors, the error evaluation component 425 may be configured as or otherwise support a means for determining a second quantity of errors associated with a word line of the second subblock.

In some examples, to support determining the first quantity of access errors, the error evaluation component 425 may be configured as or otherwise support a means for determining a first total quantity of errors associated with the first subblock. In some examples, to support determining the second quantity of access errors, the error evaluation component 425 may be configured as or otherwise support a means for determining a second total quantity of errors associated with the second subblock.

In some examples, to support determining the first quantity of access errors, the error evaluation component 425 may be configured as or otherwise support a means for determining a first quantity of uncorrectable errors associated with reading memory cells of the first subblock. In some examples, to support determining the second quantity of access errors, the error evaluation component 425 may be configured as or otherwise support a means for determining a second quantity of uncorrectable errors associated with reading memory cells of the second subblock.

In some examples, the first subblock and the second subblock may share a plurality of access lines (e.g., bit lines, which may be common from the first subblock to the second subblock).

Figure 5:
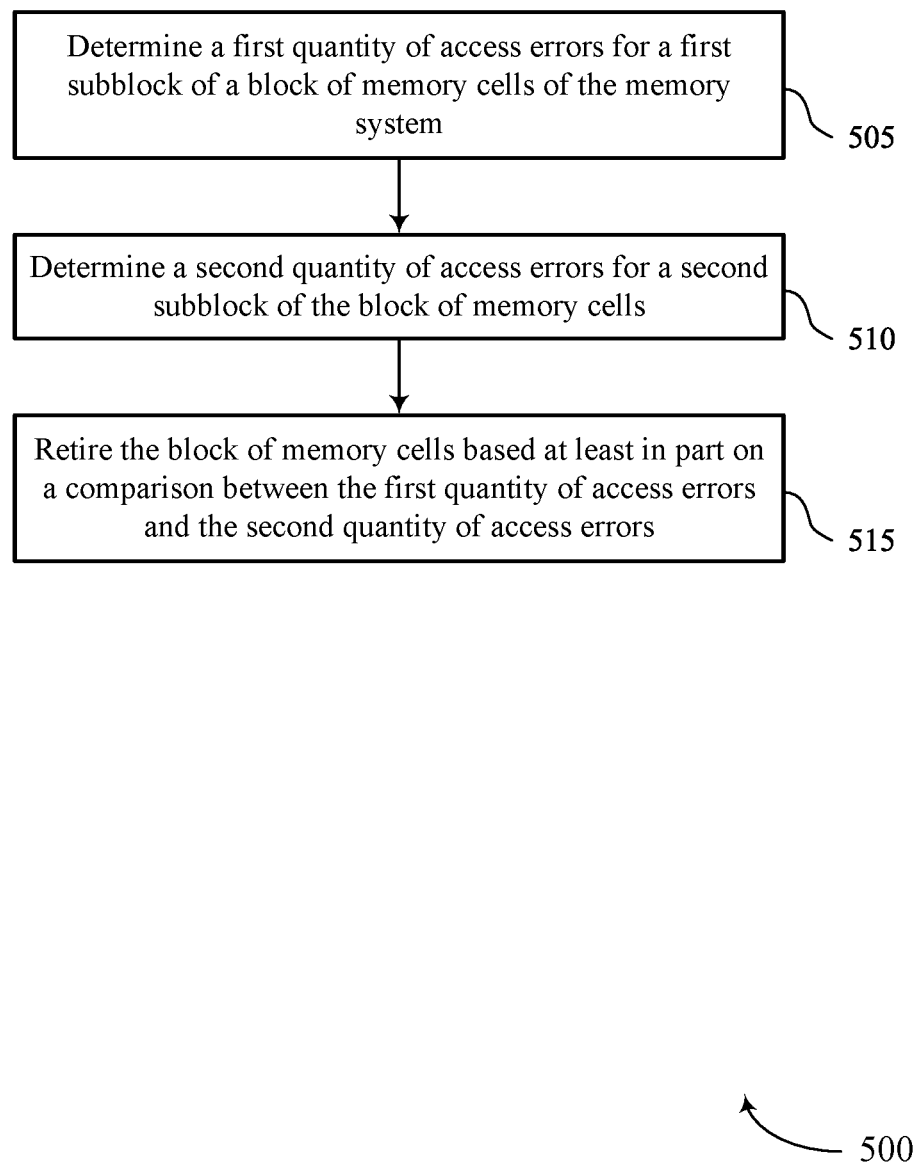
FIG. 5 shows a flowchart illustrating a method or methods that support topology-based retirement in a memory system in accordance with examples as disclosed herein.

FIG. 5 shows a flowchart illustrating a method 500 that supports topology-based retirement in a memory system in accordance with examples as disclosed herein. The operations of method 500 may be implemented by a memory system or its components as described herein. For example, the operations of method 500 may be performed by a memory system as described with reference to FIGS. 1 through 4 (e.g., a memory system 110, a memory system controller 115, a local controller 135, a memory system 420). In some examples, a memory system, or component thereof, may execute a set of instructions to control the functional elements of the device to perform the described functions. Additionally or alternatively, the memory system may perform aspects of the described functions using special-purpose hardware.

At 505, the method may include determining a first quantity of access errors for a first subblock of a block of memory cells of the memory system. The operations of 505 may be performed in accordance with examples as disclosed herein. In some examples, aspects of the operations of 505 may be performed by an error evaluation component 425 as described with reference to FIG. 4.

At 510, the method may include determining a second quantity of access errors for a second subblock of the block of memory cells. The operations of 510 may be performed in accordance with examples as disclosed herein. In some examples, aspects of the operations of 510 may be performed by an error evaluation component 425 as described with reference to FIG. 4.

At 515, the method may include retiring the block of memory cells based at least in part on a comparison between the first quantity of access errors and the second quantity of access errors. The operations of 515 may be performed in accordance with examples as disclosed herein. In some examples, aspects of the operations of 515 may be performed by a block retirement component 430 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for determining a first quantity of access errors for a first subblock of a block of memory cells of the memory system, determining a second quantity of access errors for a second subblock of the block of memory cells, and retiring the block of memory cells based at least in part on a comparison between the first quantity of access errors and the second quantity of access errors.

In some examples of the method 500 and the apparatus described herein, retiring the block of memory cells may include operations, features, circuitry, logic, means, or instructions for retiring the block of memory cells based at least in part on a difference between the second quantity of access errors and the first quantity of access errors satisfying a threshold.

In some examples of the method 500 and the apparatus described herein, retiring the block of memory cells may include operations, features, circuitry, logic, means, or instructions for retiring the block of memory cells based at least in part on the first quantity of access errors satisfying a first threshold and the second quantity of access errors satisfying a second threshold.

Some examples of the method 500 and the apparatus described herein may further include operations, features, circuitry, logic, means, or instructions for operating the block of memory cells in a read-only mode based at least in part on the retiring.

In some examples of the method 500 and the apparatus described herein, retiring the block of memory cells may include operations, features, circuitry, logic, means, or instructions for indicating that the block of memory cells is unavailable for writing information, or removing an indication that the block of memory cells is available for writing, or a combination thereof.

In some examples of the method 500 and the apparatus described herein, retiring the block of memory cells may include operations, features, circuitry, logic, means, or instructions for transferring information stored in the block of memory cells to a second block of memory cells of the memory system.

Some examples of the method 500 and the apparatus described herein may further include operations, features, circuitry, logic, means, or instructions for determining an operating temperature of the memory system associated with the first quantity of access errors and the second quantity of access errors, and retiring the block of memory cells based at least in part on the comparison between the first quantity of access errors and the second quantity of access errors and the operating temperature satisfying a temperature threshold.

Some examples of the method 500 and the apparatus described herein may further include operations, features, circuitry, logic, means, or instructions for identifying an uncorrectable error based at least in part on accessing the block of memory cells, initiating a read scan operation (e.g., a refresh operation or portion thereof, a media management operation that includes a read scan) on the block of memory cells based at least in part on identifying the uncorrectable error, and determining the first quantity of access errors and the second quantity of access errors based at least in part on initiating the read scan operation (e.g., as part of or in response to accessing memory cells during the read scan operation).

In some examples of the method 500 and the apparatus described herein, determining the first quantity of access errors may include operations, features, circuitry, logic, means, or instructions for determining a first quantity of errors associated with a word line of the first subblock. In some examples of the method 500 and the apparatus described herein, determining the second quantity of access errors may include operations, features, circuitry, logic, means, or instructions for determining a second quantity of errors associated with a word line of the second subblock.

In some examples of the method 500 and the apparatus described herein, determining the first quantity of access errors may include operations, features, circuitry, logic, means, or instructions for determining a first total quantity of errors associated with the first subblock. In some examples of the method 500 and the apparatus described herein, determining the second quantity of access errors may include operations, features, circuitry, logic, means, or instructions for determining a second total quantity of errors associated with the second subblock.

In some examples of the method 500 and the apparatus described herein, determining the first quantity of access errors may include operations, features, circuitry, logic, means, or instructions for determining a first quantity of uncorrectable errors associated with reading memory cells of the first subblock. In some examples of the method 500 and the apparatus described herein, determining the second quantity of access errors may include operations, features, circuitry, logic, means, or instructions for determining a second quantity of uncorrectable errors associated with reading memory cells of the second subblock.

In some examples of the method 500 and the apparatus described herein, the first subblock and the second subblock share a plurality of access lines (e.g., bit lines).

It should be noted that the methods described above describe possible implementations, and that the operations and the steps may be rearranged or otherwise modified and that other implementations are possible. Further, portions from two or more of the methods may be combined.

An apparatus is described. The apparatus may include a memory device including a block of memory cells and a controller coupled with the memory device (e.g., a controller in communication with the memory device, a controller of the memory device, a memory system controller 115, a local controller 135). The controller may be configured to cause the apparatus to determine a first quantity of access errors for a first subblock of the block of memory cells, determine a second quantity of access errors for a second subblock of the block of memory cells, and retire the block of memory cells based at least in part on a comparison between the first quantity of access errors and the second quantity of access errors.

In some examples, the controller may be configured to cause the apparatus to retire the block of memory cells based at least in part on a difference between the second quantity of access errors and the first quantity of access errors satisfying a threshold.

In some examples, the controller may be configured to cause the apparatus to retire the block of memory cells based at least in part on the first quantity of access errors satisfying a first threshold and the second quantity of access errors satisfying a second threshold.

In some examples, the controller may be configured to cause the apparatus to operate the block of memory cells in a read-only mode based at least in part on the retiring.

In some examples, to retire the block or memory cells, the controller may be configured to cause the apparatus to indicate that the block of memory cells is unavailable for writing information, or remove an indication that the block of memory cells is available for writing, or a combination thereof.

In some examples, to retire the block or memory cells, the controller may be configured to cause the apparatus to transfer information stored in the block of memory cells to a second block of memory cells of the memory device.

In some examples, the controller may be configured to cause the apparatus to determine an operating temperature of the memory device associated with the first quantity of access errors and the second quantity of access errors, and retire the block of memory cells based at least in part on the comparison between the first quantity of access errors and the second quantity of access errors and the operating temperature satisfying a temperature threshold.

In some examples, the controller may be configured to cause the apparatus to identify an uncorrectable error based at least in part on accessing the block of memory cells, initiate a read scan operation (e.g., a refresh operation or portion thereof, a media management operation that includes a read scan) on the block of memory cells based at least in part on identifying the uncorrectable error, and determine the first quantity of access errors and the second quantity of access errors based at least in part on initiating the read scan operation.

In some examples of the apparatus, to determine the first quantity of access errors, the controller may be configured to cause the apparatus to determine a first quantity of errors associated with a word line of the first subblock and, to determine the second quantity of access errors, the controller may be configured to cause the apparatus to determine a second quantity of errors associated with a word line of the second subblock.

In some examples of the apparatus, to determine the first quantity of access errors, the controller may be configured to cause the apparatus to determine a first total quantity of errors associated with the first subblock and, to determine the second quantity of access errors, the controller may be configured to cause the apparatus to determine a second total quantity of errors associated with the second subblock.

In some examples of the apparatus, to determine the first quantity of access errors, the controller may be configured to cause the apparatus to determine a first quantity of uncorrectable errors associated with reading memory cells of the first subblock and, to determine the second quantity of access errors, the controller may be configured to cause the apparatus to determine a second quantity of uncorrectable errors associated with reading memory cells of the second subblock.

In some examples of the apparatus, the first subblock and the second subblock share a plurality of bit lines.

A non-transitory computer-readable medium is described. The non-transitory computer-readable medium may store code including instructions which, when executed by a processor of an electronic device, cause the electronic device to determine a first quantity of access errors for a first subblock of a block of memory cells of the electronic device, determine a second quantity of access errors for a second subblock of the block of memory cells, and retire the block of memory cells based at least in part on a comparison between the first quantity of access errors and the second quantity of access errors.

In some examples of the non-transitory computer-readable medium, the instructions to retire the block of memory cells, when executed by the processor of the electronic device, may cause the electronic device to retire the block of memory cells based at least in part on a difference between the second quantity of access errors and the first quantity of access errors satisfying a threshold.

In some examples of the non-transitory computer-readable medium, the instructions to retire the block of memory cells, when executed by the processor of the electronic device, may cause the electronic device to retire the block of memory cells based at least in part on the first quantity of access errors satisfying a first threshold and the second quantity of access errors satisfying a second threshold.

In some examples of the non-transitory computer-readable medium, the instructions, when executed by the processor of the electronic device, may cause the electronic device to operate the block of memory cells in a read-only mode based at least in part on the retiring.

In some examples of the non-transitory computer-readable medium, the instructions to retire the block of memory cells, when executed by the processor of the electronic device, may cause the electronic device to indicate that the block of memory cells is unavailable for writing information, or remove an indication that the block of memory cells is available for writing, or a combination thereof.

In some examples of the non-transitory computer-readable medium, the instructions to retire the block of memory cells, when executed by the processor of the electronic device, may cause the electronic device to transfer information stored in the block of memory cells to a second block of memory cells of the electronic device.

In some examples of the non-transitory computer-readable medium, the instructions, when executed by the processor of the electronic device, may cause the electronic device to determine an operating temperature of the electronic device associated with the first quantity of access errors and the second quantity of access errors, and retire the block of memory cells based at least in part on the comparison between the first quantity of access errors and the second quantity of access errors and the operating temperature satisfying a temperature threshold.

In some examples of the non-transitory computer-readable medium, the instructions, when executed by the processor of the electronic device, may cause the electronic device to identify an uncorrectable error based at least in part on accessing the block of memory cells, initiate a read scan operation (e.g., a refresh operation or portion thereof, a media management operation that includes a read scan) on the block of memory cells based at least in part on identifying the uncorrectable error, and determine the first quantity of access errors and the second quantity of access errors based at least in part on initiating the read scan operation.

In some examples of the non-transitory computer-readable medium, the instructions to determine the first quantity of access errors, when executed by the processor of the electronic device, may cause the electronic device to determine a first quantity of errors associated with a word line of the first subblock, and the instructions to determine the second quantity of access errors, when executed by the processor of the electronic device, may cause the electronic device to determine a second quantity of errors associated with a word line of the second subblock.

In some examples of the non-transitory computer-readable medium, the instructions to determine the first quantity of access errors, when executed by the processor of the electronic device, may cause the electronic device to determine a first total quantity of errors associated with the first subblock, and the instructions to determine the second quantity of access errors, when executed by the processor of the electronic device, may cause the electronic device to determine a second total quantity of errors associated with the second subblock.

In some examples of the non-transitory computer-readable medium, the instructions to determine the first quantity of access errors, when executed by the processor of the electronic device, may cause the electronic device to determine a first quantity of uncorrectable errors associated with reading memory cells of the first subblock, and the instructions to determine the second quantity of access errors, when executed by the processor of the electronic device, may cause the electronic device to determine a second quantity of uncorrectable errors associated with reading memory cells of the second subblock.

In some examples of the non-transitory computer-readable medium, the first subblock and the second subblock share a plurality of access lines (e.g., bit lines).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
   one or more memory devices comprising a block of memory cells; and
   processing circuitry coupled with the one or more memory devices and configured to cause the memory system to:
      determine a first quantity of access errors for a first subblock of the block of memory cells;
      determine a second quantity of access errors for a second subblock of the block of memory cells; and
      retire the block of memory cells based at least in part on a difference between the first quantity of access errors and the second quantity of access errors satisfying a threshold.

2. The memory system of claim 1, wherein:
   to determine the first quantity of access errors, the processing circuitry is configured to cause the memory system to determine a first quantity of errors associated with a word line of the first subblock; and
   to determine the second quantity of access errors, the processing circuitry is configured to cause the memory system to determine a second quantity of errors associated with a word line of the second subblock.

3. The memory system of claim 1, wherein:
   to determine the first quantity of access errors, the processing circuitry is configured to cause the memory system to determine a first total quantity of errors associated with the first subblock; and
   to determine the second quantity of access errors, the processing circuitry is configured to cause the memory system to determine a second total quantity of errors associated with the second subblock.

4. The memory system of claim 1, wherein the processing circuitry is configured to cause the memory system to:
   retire the block of memory cells based at least in part on the first quantity of access errors satisfying a first threshold and the second quantity of access errors satisfying a second threshold.

5. The memory system of claim 1, wherein the processing circuitry is configured to cause the memory system to:
   operate the block of memory cells in a read-only mode based at least in part on the retiring.

6. The memory system of claim 1, wherein, to retire the block of memory cells, the processing circuitry is configured to cause the memory system to:
   indicate that the block of memory cells is unavailable for writing information, or remove an indication that the block of memory cells is available for writing, or a combination thereof.

7. The memory system of claim 1, wherein, to retire the block of memory cells, the processing circuitry is configured to cause the cause the memory system to:
   transfer information stored in the block of memory cells to a second block of memory cells of the one or more memory devices.

8. The memory system of claim 1, wherein the processing circuitry is configured to cause the memory system to:
   determine an operating temperature of the memory system associated with the first quantity of access errors and the second quantity of access errors; and
   retire the block of memory cells based at least in part on the difference between the first quantity of access errors and the second quantity of access errors satisfying the threshold and the operating temperature satisfying a temperature threshold.

9. The memory system of claim 1, wherein the processing circuitry is configured to cause the memory system to:
identify an uncorrectable error based at least in part on accessing the block of memory cells;
initiate a refresh operation on the block of memory cells based at least in part on identifying the uncorrectable error; and
determine the first quantity of access errors and the second quantity of access errors based at least in part on initiating the refresh operation.

10. The memory system of claim 1, wherein:
to determine the first quantity of access errors, the processing circuitry is configured to cause the memory system to determine a first quantity of uncorrectable errors associated with reading memory cells of the first subblock; and
to determine the second quantity of access errors, the processing circuitry is configured to cause the memory system to determine a second quantity of uncorrectable errors associated with reading memory cells of the second subblock.

11. The memory system of claim 1, wherein the first subblock and the second subblock share a plurality of bit lines.

12. A non-transitory computer-readable medium storing code comprising instructions which, when executed by processing circuitry of an electronic device, cause the electronic device to:
determine a first quantity of access errors for a first subblock of a block of memory cells of the electronic device;
determine a second quantity of access errors for a second subblock of the block of memory cells; and
retire the block of memory cells based at least in part on a difference between the first quantity of access errors and the second quantity of access errors satisfying a threshold.

13. The non-transitory computer-readable medium of claim 12, wherein the instructions to retire the block of memory cells, when executed by the processing circuitry of the electronic device, cause the electronic device to retire the block of memory cells based at least in part on the first quantity of access errors satisfying a first threshold and the second quantity of access errors satisfying a second threshold.

14. The non-transitory computer-readable medium of claim 12, wherein the instructions, when executed by the processing circuitry of the electronic device, cause the electronic device to operate the block of memory cells in a read-only mode based at least in part on the retiring.

15. The non-transitory computer-readable medium of claim 12, wherein the instructions to retire the block of memory cells, when executed by the processing circuitry of the electronic device, cause the electronic device to indicate that the block of memory cells is unavailable for writing information, or removing an indication that the block of memory cells is available for writing, or a combination thereof.

16. The non-transitory computer-readable medium of claim 12, wherein the instructions to retire the block of memory cells, when executed by the processing circuitry of the electronic device, cause the electronic device to transfer information stored in the block of memory cells to a second block of memory cells of the electronic device.

17. The non-transitory computer-readable medium of claim 12, wherein the instructions, when executed by the processing circuitry of the electronic device, cause the electronic device to:
determine an operating temperature of the electronic device associated with the first quantity of access errors and the second quantity of access errors; and
retire the block of memory cells based at least in part on the difference between the first quantity of access errors and the second quantity of access errors satisfying the threshold and the operating temperature satisfying a temperature threshold.

18. The non-transitory computer-readable medium of claim 12, wherein the instructions, when executed by the processing circuitry of the electronic device, cause the electronic device to:
identify an uncorrectable error based at least in part on accessing the block of memory cells;
initiate a refresh operation on the block of memory cells based at least in part on identifying the uncorrectable error; and
determine the first quantity of access errors and the second quantity of access errors based at least in part on initiating the refresh operation.

19. The non-transitory computer-readable medium of claim 12, wherein:
the instructions to determine the first quantity of access errors, when executed by the processing circuitry of the electronic device, cause the electronic device to determine a first quantity of errors associated with a word line of the first subblock; and
the instructions to determine the second quantity of access errors, when executed by the processing circuitry of the electronic device, cause the electronic device to determine a second quantity of errors associated with a word line of the second subblock.

20. The non-transitory computer-readable medium of claim 12, wherein:
the instructions to determine the first quantity of access errors, when executed by the processing circuitry of the electronic device, cause the electronic device to determine a first total quantity of errors associated with the first subblock; and
the instructions to determine the second quantity of access errors, when executed by the processing circuitry of the electronic device, cause the electronic device to determine a second total quantity of errors associated with the second subblock.

21. The non-transitory computer-readable medium of claim 12, wherein:
the instructions to determine the first quantity of access errors, when executed by the processing circuitry of the electronic device, cause the electronic device to determine a first quantity of uncorrectable errors associated with reading memory cells of the first subblock; and
the instructions to determine the second quantity of access errors, when executed by the processing circuitry of the electronic device, cause the electronic device to determine a second quantity of uncorrectable errors associated with reading memory cells of the second subblock.

22. The non-transitory computer-readable medium of claim 12, wherein the first subblock and the second subblock share a plurality of bit lines.

23. A method performed by a memory system, the method comprising:

determining a first quantity of access errors for a first subblock of a block of memory cells of the memory system;
determining a second quantity of access errors for a second subblock of the block of memory cells; and
retiring the block of memory cells based at least in part on a difference between the first quantity of access errors and the second quantity of access errors satisfying a threshold.

* * * * *